# (12) United States Patent
Degen et al.

(10) Patent No.: US 8,427,030 B2
(45) Date of Patent: Apr. 23, 2013

(54) THERMOMAGNETIC GENERATOR

(75) Inventors: Georg Degen, Lorsch (DE); Bennie Reesink, De Meern (NL); Ekkehard Brueck, Delft (NL)

(73) Assignee: BASF SE, Ludwigshafen (DE)

( * ) Notice: Subject to any disclaimer, the term of this patent is extended or adjusted under 35 U.S.C. 154(b) by 189 days.

(21) Appl. No.: 12/990,094

(22) PCT Filed: Apr. 27, 2009

(86) PCT No.: PCT/EP2009/055022
§ 371 (c)(1),
(2), (4) Date: Oct. 28, 2010

(87) PCT Pub. No.: WO2009/133047
PCT Pub. Date: Nov. 5, 2009

(65) Prior Publication Data
US 2011/0037342 A1   Feb. 17, 2011

(30) Foreign Application Priority Data
Apr. 28, 2008 (EP) .................... 08155253

(51) Int. Cl.
*H02N 10/00* (2006.01)
(52) U.S. Cl.
USPC ........................................... 310/306
(58) Field of Classification Search ............ 310/306, 310/307; 62/3.1
See application file for complete search history.

(56) References Cited

U.S. PATENT DOCUMENTS

| | | | |
|---|---|---|---|
| 428,057 A | 5/1890 | Tesla | |
| 476,983 A | 6/1892 | Edison | |
| 4,435,663 A * | 3/1984 | Gambino et al. | 310/306 |
| 6,725,668 B1 | 4/2004 | Cornwall | |
| 2005/0062360 A1 | 3/2005 | Yabuta | |
| 2006/0117758 A1 | 6/2006 | Bruck et al. | |
| 2008/0236172 A1 | 10/2008 | Muller et al. | |
| 2010/0109474 A1 * | 5/2010 | Russberg et al. | 310/306 |

FOREIGN PATENT DOCUMENTS

| | | |
|---|---|---|
| DE | 10 2006 015370 | 10/2006 |
| FR | 2 890 158 | 3/2007 |
| JP | 2005086904 A2 | 3/2005 |
| WO | 00 64038 | 10/2000 |
| WO | 2004 068512 | 8/2004 |

OTHER PUBLICATIONS

U.S. Appl. No. 12/852,750, filed Aug. 9, 2010, Reesink.
U.S. Appl. No. 13/044,977, filed Mar. 10, 2011, Brueck, et al.
U.S. Appl. No. 12/887,138, Sep. 21, 2010, Brueck.
U.S. Appl. No. 13/259,882, filed Sep. 23, 2011, Seeler, et al.
International Search Report issued Oct. 27, 2009 in PCT/EP09/055022 filed Apr. 27, 2009.
U.S. Appl. No. 12/831,524, filed Jul. 7, 2010, Degen, et al.
U.S. Appl. No. 12/984,080, filed Jan. 4, 2011, Reesink, et al.

* cited by examiner

*Primary Examiner* — Nguyen N Hanh
(74) *Attorney, Agent, or Firm* — Oblon, Spivak, McClelland, Maier & Neustadt, L.L.P.

(57) ABSTRACT

A thermomagnetic generator which converts thermal energy to electrical energy without intermediate conversion to mechanical work and which works at temperatures in the range from −20° C. to 200° C. comprises a thermomagnetic material selected from, for example, (1) compounds of the general formula (I)

$$(A_yB_{y-1})_{2+\delta}C_wD_xE_z \quad (I)$$

where
A is Mn or Co,
B is Fe, Cr or Ni,
C, D and E at least two of C, D and E are different, have a non-vanishing concentration and are selected from P, B, Se, Ge, Ga, Si, Sn, N, As and Sb, where at least one of C, D and E is Ge or Si,
δ is a number in the range from −0.1 to 0.1,
w, x, y, z are numbers in the range from 0 to 1, where w+x+z=1.

9 Claims, No Drawings

THERMOMAGNETIC GENERATOR

The invention relates to a thermomagnetic generator which converts thermal energy to electrical energy without intermediate conversion to mechanical work.

The materials used in thermomagnetic generators are based on the magnetocaloric effect (MCE). In a material which exhibits a magnetocaloric effect, the alignment of randomly aligned magnetic moments by an external magnetic field leads to heating of the material. This heat can be released by the MCE material into the surrounding atmosphere by a heat transfer. When the magnetic field is then switched off or removed, the magnetic moments revert back to a random alignment, which leads to cooling of the material below ambient temperature. This effect can be exploited firstly for cooling purposes, and secondly for conversion of heat to electrical energy.

The magnetocaloric generation of electrical energy is associated with magnetic heating and cooling. At the time of first conception, the process for energy generation was described as pyromagnetic energy generation. Compared to devices of the Peltier or Seebeck type, these magnetocaloric devices can have a significantly higher energy efficiency.

The research into this physical phenomenon began in the late $19^{th}$ century, when two scientists, Tesla and Edison, filed a patent on pyromagnetic generators. In 1984, Kirol described numerous possible applications and conducted thermodynamic analyses thereof. At that time, gadolinium was considered to be a potential material for applications close to room temperature.

A pyromagnetoelectric generator is described, for example, by N. Tesla in U.S. Pat. No. 428,057. It is stated that the magnetic properties of iron or other magnetic substances can be destroyed partially or entirely or can disappear as a result of heating to a particular temperature. In the course of cooling, the magnetic properties are re-established and return to the starting state. This effect can be exploited to generate electrical power. When an electrical conductor is exposed to a varying magnetic field, the changes in the magnetic field lead to the induction of an electrical current in the conductor. When, for example, the magnetic material is surrounded by a coil and is then heated in a permanent magnetic field and then cooled, an electrical current is induced in the coil in the course of heating and cooling in each case. This allows thermal energy to be converted to electrical energy, without an intermediate conversion to mechanical work. In the process described by Tesla, iron, as the magnetic substance, is heated by means of an oven or a closed fireplace and then cooled again.

T. A. Edison likewise describes, in U.S. Pat. No. 476,983, a pyromagnetic generator in which iron is again used as the thermomagnetic material. The iron is used in the form of tubes of small diameter, which are combined to tube bundles. Each tube is as thin as possible, such that it can be heated and cooled rapidly. The iron is protected from oxidation by nickel plating or enameling. The tube bundles are arranged on a circular plate and are heated and cooled in succession while a magnetic field acts on them. The heating is again achieved by means of a furnace, the fresh air required for the furnace being conducted through the tubes, which are to be cooled.

L. D. Kirol and J. I. Mills describe theoretical calculations for thermomagnetic generators. These proceed from magnetic fields which are achieved by a superconductive magnet. The materials considered are iron, gadolinium and $Ho_{69}Fe_{13}$, as well as a hypothetical material. The materials considered have either very low Curie temperatures or very high Curie temperatures, while no material is described for the desired work at ambient temperature.

It is an object of the present invention to provide a thermoelectric generator which converts thermal energy to electrical energy without intermediate conversion to mechanical work, which works at temperatures close to room temperature with high energy yields. It should thus be possible to be able to exploit a magnetocaloric effect for the generation of power from waste heat at and around room temperature.

It should thus be possible to obtain power from wastewater or from waste heat from industrial processes or from solar energy or solar collectors.

The object is achieved in accordance with the invention by a thermomagnetic generator which converts thermal energy to electrical energy without intermediate conversion to mechanical work, which works at temperatures in the range from $-20°$ C. to $200°$ C. and comprises a thermomagnetic material selected from (1) compounds of the general formula (I)

$$(A_yB_{1-y})_{2+\delta}C_wD_xE_z \quad \text{(I)}$$

where
A is Mn or Co,
B is Fe, Cr or Ni,
C, D and E at least two of C, D and E are different, have a non-vanishing concentration and are selected from P, B, Se, Ge, Ga, Si, Sn, N, As and Sb, where at least one of C, D and E is Ge or Si,
$\delta$ is a number in the range from $-0.1$ to $0.1$,
w, x, y, z are numbers in the range from 0 to 1, where $w+x+z=1$;

(2) La- and Fe-based compounds of the general formulae (II) and/or (III) and/or (IV)

$$La(Fe_xAl_{1-x})_{13}H_y \text{ or } La(Fe_xSi_{1-x})_{13}H_y \quad \text{(II)}$$

where
x is a number from 0.7 to 0.95,
y is a number from 0 to 3, preferably from 0 to 2;

$$La(Fe_xAl_yCo_z)_{13} \text{ or } La(Fe_xSi_yCo_z)_{13} \quad \text{(III)}$$

where
x is a number from 0.7 to 0.95,
y is a number from 0.05 to $1-x$,
z is a number from 0.005 to 0.5;

$$LaMn_xFe_{2-x}Ge \quad \text{(IV)}$$

where
x is a number from 1.7 to 1.95 and (3) Heusler alloys of the MnTP type where T is a transition metal and P is a p-doping metal having an electron count per atom e/a in the range from 7 to 8.5.

(4) Gd- and Si-based compounds of the general formula (V)

$$Gd_5(Si_xGe_{1-x})_4 \quad \text{(V)}$$

where x is a number from 0.2 to 1, (5) $Fe_2P$-based compounds,
(6) manganites of the perovskite type,
(7) compounds which comprise rare earth elements and are of the general formulae (VI) and (VII)

$$Tb_5(Si_{4-x}Ge_x) \quad \text{(VI)}$$

where x=0, 1, 2, 3, 4, $$XTiGe \quad \text{(VII)}$$

where X=Dy, Ho, Tm,
(8) Mn- and Sb- or As-based compounds of the general formulae (VIII) and (IX)

$$Mn_{2-x}Z_xSb \quad (VIII)$$

$$Mn_2Z_xSb_{1-x} \quad (IX)$$

where

Z is Cr, Cu, Zn, Co, V, As, Ge, x is from 0.01 to 0.5, where Sb may be replaced by As when Z is not As.

It has been found in accordance with the invention that the aforementioned thermomagnetic materials can be used advantageously in thermomagnetic generators, in order to enable the conversion of (waste) heat to electrical power in the region of room temperature, i.e. at temperatures in the range from −20 to 200° C. The energy is converted preferably at temperatures in the range from 20 to 150° C., especially at temperatures in the range from 40 to 120° C.

The materials used in accordance with the invention are known in principle and some are described, for example, in WO 2004/068512.

The metal-based material is selected from the above materials (1) to (8).

Particular preference is given in accordance with the invention to the metal-based materials selected from compounds (1), (2) and (3), and also (5).

Materials particularly suitable in accordance with the invention are described, for example, in WO 2004/068512, Rare Metals, Vol. 25, 2006, pages 544 to 549, J. Appl. Phys. 99, 08Q107 (2006), Nature, Vol. 415, Jan. 10, 2002, pages 150 to 152 and Physica B 327 (2003), pages 431 to 437.

In the aforementioned compounds of the general formula (I), C, D and E are preferably identical or different and are selected from at least one of P, Ge, Si, Sn and Ga.

The metal-based material of the general formula (I) is preferably selected from at least quaternary compounds which, as well as Mn, Fe, P and if appropriate Sb, additionally comprise Ge or Si or As or Ge and Si, Ge and As or Si and As, or Ge, Si and As.

Preferably at least 90% by weight, more preferably at least 95% by weight, of component A is Mn. Preferably at least 90% by weight, more preferably at least 95% by weight, of B is Fe. Preferably at least 90% by weight, more preferably at least 95% by weight, of C is P. Preferably at least 90% by weight, more preferably at least 95% by weight, of D is Ge. Preferably at least 90% by weight, more preferably at least 95% by weight, of E is Si.

The material preferably has the general formula $MnFe(P_wGe_xSi_z)$.

x is preferably a number in the range from 0.3 to 0.7, w is less than or equal to 1−x and z corresponds to 1−x−w.

The material preferably has the crystalline hexagonal $Fe_2P$ structure. Examples of suitable materials are $MnFeP_{0.45\,to\,0.7}$, $Ge_{0.55\,to\,0.30}$ and $MnFeP_{0.5\,to\,0.70}$, $(Si/Ge)_{0.5\,to\,0.30}$.

Suitable compounds are additionally $M_{n1+x}Fe_{1-x}P_{1-y}Ge_y$ with x in the range from −0.3 to 0.5, y in the range from 0.1 to 0.6. Likewise suitable are compounds of the general formula $Mn_{1+x}Fe_{1-x}P_{1-y}Ge_{y-z}Sb_z$ with x in the range from −0.3 to 0.5, y in the range from 0.1 to 0.6 and z less than y and less than 0.2. Also suitable are compounds of the formula $Mn_{1+x}Fe_{1-x}P_{1-y}Ge_{y-z}Si_z$ with x in the range from 0.3 to 0.5, y in the range from 0.1 to 0.66, z less than or equal to y and less than 0.6.

Also suitable are further $Fe_2P$— based compounds proceeding from $Fe_2P$ and $FeAs_2$, optionally Mn and P. They correspond, for example, to the general formulae $MnFe_{1-x}Co_xGe$, where x=0.7-0.9, $Mn_{5-x}Fe_xSi_3$ where x=0-5, $Mn_5Ge_{3-x}Si_x$ where x=0.1-2, $Mn_5Ge_{3-x}Sb_x$ where x=0-0.3, $Mn_{2-x}Fe_xGe_2$ where x=0.1-0.2 $(Fe_{1-x}Mn_x)_3C$ where x=. . . − . . . , $Mn_{3-x}Co_xGaC$ where x=0-0.05.

Preferred La- and Fe-based compounds of the general formulae (II) and/or (III) and/or (IV) are $La(Fe_{0.90}Si_{0.10})_{13}$, $La(Fe_{0.89}Si_{0.11})_{13}$, $La(Fe_{0.880}Si_{0.120})_{13}$, $La(Fe_{0.877}Si_{0.123})_{13}$, $LaFe_{11.8}Si_{1.2}$, $La(Fe_{0.88}Si_{0.12})_{13}H_{0.5}$, $La(Fe_{0.88}Si_{0.12})_{13}H_{1.0}$, $LaFe_{11.7}Si_{1.3}H_{1.1}$, $LaFe_{11.57}Si_{1.43}H_{1.3}$, $La(Fe_{0.88}Si_{0.12})H_{1.5}$, $LaFe_{11.2}Co_{0.7}Si_{1.1}$, $LaFe_{11.5}Al_{1.5}Co_{0.1}$, $LaFe_{11.5}Al_{1.5}Co_{0.2}$, $LaFe_{11.5}Al_{1.5}Co_{0.4}$, $LaFe_{11.5}Al_{1.5}Co_{0.5}$, $La(Fe_{0.94}Co_{0.06})_{11.83}Al_{1.17}$, $La(Fe_{0.92}Co_{0.08})_{11.83}Al_{1.17}$.

Suitable manganese-comprising compounds are MnFeGe, $MnFe_{0.9}Co_{0.1}Ge$, $MnFe_{0.8}Co_{0.2}Ge$, $MnFe_{0.7}Co_{0.3}Ge$, $MnFe_{0.6}Co_{0.4}Ge$, $MnFe_{0.5}Co_{0.5}Ge$, $MnFe_{0.4}Co_{0.6}Ge$, $MnFe_{0.3}Co_{0.7}Ge$, $MnFe_{0.2}Co_{0.8}Ge$, $MnFe_{0.15}Co_{0.85}Ge$, $MnFe_{0.1}Co_{0.9}Ge$, MnCoGe, $Mn_5Ge_{2.5}Si_{0.5}$, $Mn_5Ge_2Si$, $Mn_5Ge_{1.5}Si_{1.5}$, $Mn_5GeSi_2$, $Mn_5Ge_3$, $Mn_5Ge_{2.9}Sb_{0.1}$, $Mn_5Ge_{2.8}Sb_{0.2}$, $Mn_5Ge_{2.7}Sb_{0.3}$, $LaMn_{1.9}Fe_{0.1}Ge$, $LaMn_{1.85}Fe_{0.15}Ge$, $LaMn_{1.8}Fe_{0.2}Ge$, $(Fe_{0.9}Mn_{0.1})_3O$, $(Fe_{0.8}Mn_{0.2})_3C$, $(Fe_{0.7}Mn_{0.3})_3C$, $Mn_3GaC$, MnAs, $(Mn,Fe)As$, $Mn_{1+\delta}As_{0.8}Sb_{0.2}$, $MnAs_{0.75}Sb_{0.25}$, $Mn_{1.1}As_{0.75}Sb_{0.25}$, $Mn_{1.5}As_{0.75}Sb_{0.25}$.

Heusler alloys suitable in accordance with the invention are, for example, $Ni_2MnGa$, $Fe_2MnSi_{1-x}Ge_x$ with x=0-1 such as $Fe_2MnSi_{0.5}Ge_{0.5}$, $Ni_{52.9}Mn_{22.4}Ga_{24.7}$, $Ni_{50.9}Mn_{24.7}Ga_{24.4}$, $Ni_{55.2}Mn_{18.6}Ga_{26.2}$, $Ni_{51.6}Mn_{24.7}Ga_{23.8}$, $Ni_{52.7}Mn_{23.9}Ga_{23.4}$, CoMnSb, $CoNb_{0.2}Mn_{0.8}Sb$, $CoNb_{0.4}Mn_{0.6}SB$, $CoNb_{0.6}Mn_{0.4}Sb$, $Ni_{50}Mn_{35}Sn_{15}$, $Ni_{50}Mn_{37}Sn_{13}$, $MnFeP_{0.45}As_{0.55}$, $MnFeP_{0.47}As_{0.53}$, $Mn_{1.1}Fe_{0.9}P_{0.47}As_{0.53}$, $MnFeP_{0.89-x}Si_xGe_{0.11}$, X=0.22, X=0.26, x=0.30, x=0.33.

Additionally suitable are $Fe_{90}Zr_{10}$, $Fe_{82}Mn_8Zr_{10}$, $CO_{66}Nb_9Cu_1Si_{12}B_{12}$, $Pd_{40}Ni_{22.5}Fe_{17.5}P_{20}$, FeMoSiBCuNb, $Gd_{70}Fe_{30}$, GdNiAl, $NdFe_{12}B_6GdMn_2$.

Manganites of the perovskite type are, for example, $La_{0.6}Ca_{0.4}MnO_3$, $La_{0.67}Ca_{0.33}MnO_3$, $La_{0.8}Ca_{0.2}MnO_3$, $La_{0.7}Ca_{0.3}MnO_3$, $La_{0.958}Li_{0.025}Ti_{0.1}Mn_{0.9}O_3$, $La_{0.65}Ca_{0.35}Ti_{0.1}Mn_{0.9}O_3$, $La_{0.799}Na_{0.199}MnO_{2.97}$, $La_{0.88}Ne_{0.099}Mn_{0.977}O_3$, $La_{0.877}K_{0.096}Mn_{0.974}O_3$, $La_{0.65}Sr_{0.35}Mn_{0.95}Cn_{0.05}O_3$, $La_{0.7}Nd_{0.1}Na_{0.2}MnO_3$, $La_{0.5}Ca_{0.3}Sr_{0.2}MnO_3$.

Gd- and Si-based compounds of the general formula (V)

$$Gd_5(Si_xGe_{1-x})_4$$

where x is a number from 0.2 to 1 are, for example, $Gd_5(Si_{0.5}Ge_{0.5})_4$, $Gd_5(Si_{0.425}Ge_{0.575})_4$, $Gd_5(Si_{0.45}Ge_{0.55})_4$, $Gd_5(Si_{0.365}Ge_{0.635})_4$, $Gd_5(Si_{0.3}Ge_{0.7})_4$, $Gd_5(Si_{0.25}Ge_{0.75})_4$.

Compounds comprising rare earth elements are $Tb_5(Si_{4-x}Ge_x)$ with x=0, 1, 2, 3, 4 or XTiGe with X=Dy, Ho, Tm, for example $Tb_5Si_4$, $Tb_5(Si_3Ge)$, $Tb(Si_2Ge_2)$, $Tb_5Ge_4$, DyTiGe, HoTiGe, TmTiGe.

Mn- and Sb- or As-based compounds of the general formulae (VIII) and (IX) preferably have the definitions of z=0.05 to 0.3, Z=Cr, Cn, Ge, As, Co.

The thermomagnetic materials used in accordance with the invention can be produced in any suitable manner.

The thermomagnetic materials are produced, for example, by solid phase reaction of the starting elements or starting alloys for the material in a ball mill, subsequent pressing, sintering and heat treatment under inert gas atmosphere and subsequent slow cooling to room temperature. Such a process is described, for example, in J. Appl. Phys. 99, 2006, 08Q107.

Processing via melt spinning is also possible. This makes possible a more homogeneous element distribution which leads to an improved magnetocaloric effect; cf. Rare Metals, Vol. 25, October 2006, pages 544 to 549. In the process described there, the starting elements are first induction-melted in an argon gas atmosphere and then sprayed in the molten state through a nozzle onto a rotating copper roller. There follows sintering at 1000° C. and slow cooling to room temperature.

In addition, reference may be made to WO 2004/068512 for the production.

The materials obtained by these processes frequently exhibit high thermal hysteresis. For example, in compounds of the $Fe_2P$ type substituted by germanium or silicon, large values for thermal hysteresis are observed within a wide range of 10 K or more.

Preference is therefore given to a process for producing the thermomagnetic materials for the magnetic cooling, comprising the following steps:

a) reacting chemical elements and/or alloys in a stoichiometry which corresponds to the metal-based material in the solid and/or liquid phase,
b) if appropriate converting the reaction product from stage a) to a solid,
c) sintering and/or heat treating the solid from stage a) or b),
d) quenching the sintered and/or heat-treated solid from stage c) at a cooling rate of at least 100 K/s.

The thermal hysteresis can be reduced significantly and a large magnetocaloric effect can be achieved when the metal-based materials are not cooled slowing to ambient temperature after the sintering and/or heat treatment, but rather are quenched at a high cooling rate. This cooling rate is at least 100 K/s. The cooling rate is preferably from 100 to 10 000 K/s, more preferably from 200 to 1300 K/s. Especially preferred cooling rates are from 300 to 1000 K/s.

The quenching can be achieved by any suitable cooling processes, for example by quenching the solid with water or aqueous liquids, for example cooled water or ice/water mixtures. The solids can, for example, be allowed to fall into ice-cooled water. It is also possible to quench the solids with subcooled gases such as liquid nitrogen. Further processes for quenching are known to those skilled in the art. What is advantageous here is controlled and rapid cooling.

The rest of the production of the thermomagnetic materials is less critical, provided that the last step comprises the quenching of the sintered and/or heat-treated solid at the inventive cooling rate. The process may be applied to the production of any suitable thermomagnetic materials for magnetic cooling, as described above.

In step (a) of the process, the elements and/or alloys which are present in the later thermomagnetic material are converted in a stoichiometry which corresponds to the thermomagnetic material in the solid or liquid phase.

Preference is given to performing the reaction in stage a) by combined heating of the elements and/or alloys in a closed vessel or in an extruder, or by solid phase reaction in a ball mill. Particular preference is given to performing a solid phase reaction, which is effected especially in a ball mill. Such a reaction is known in principle; cf. the documents cited above. Typically, powders of the individual elements or powders of alloys of two or more of the individual elements which are present in the later thermomagnetic material are mixed in pulverulent form in suitable proportions by weight. If necessary, the mixture can additionally be ground in order to obtain a microcrystalline powder mixture. This powder mixture is preferably heated in a ball mill, which leads to further comminution and also good mixing, and to a solid phase reaction in the powder mixture. Alternatively, the individual elements are mixed as a powder in the selected stoichiometry and then melted.

The combined heating in a closed vessel allows the fixing of volatile elements and control of the stoichiometry. Specifically in the case of use of phosphorus, this would evaporate easily in an open system.

The reaction is followed by sintering and/or heat treatment of the solid, for which one or more intermediate steps can be provided. For example, the solid obtained in stage a) can be pressed before it is sintered and/or heat treated. This allows the density of the material to be increased, such that a high density of the thermomagnetic material is present in the later application. This is advantageous especially because the volume within which the magnetic field exists can be reduced, which may be associated with considerable cost savings. Pressing is known per se and can be carried out with or without pressing aids. It is possible to use any suitable mold for pressing. By virtue of the pressing, it is already possible to obtain shaped bodies in the desired three-dimensional structure. The pressing may be followed by the sintering and/or heat treatment of stage c), followed by the quenching of stage d).

Alternatively, it is possible to send the solid obtained from the ball mill to a melt-spinning process. Melt-spinning processes are known per se and are described, for example, in Rare Metals, Vol. 25, October 2006, pages 544 to 549, and also in WO 2004/068512.

In these processes, the composition obtained in stage a) is melted and sprayed onto a rotating cold metal roller. This spraying can be achieved by means of elevated pressure upstream of the spray nozzle or reduced pressure downstream of the spray nozzle. Typically, a rotating copper drum or roller is used, which can additionally be cooled if appropriate. The copper drum preferably rotates at a surface speed of from 10 to 40 m/s, especially from 20 to 30 m/s. On the copper drum, the liquid composition is cooled at a rate of preferably from $10^2$ to $10^7$ K/s, more preferably at a rate of at least $10^4$ K/s, especially with a rate of from 0.5 to $2\times10^6$ K/s.

The melt-spinning, like the reaction in stage a) too, can be performed under reduced pressure or under an inert gas atmosphere.

The melt-spinning achieves a high processing rate, since the subsequent sintering and heat treatment can be shortened. Specifically on the industrial scale, the production of the thermomagnetic materials thus becomes significantly more economically viable. Spray-drying also leads to a high processing rate. Particular preference is given to performing melt spinning.

Alternatively, in stage b), spray cooling can be carried out, in which a melt of the composition from stage a) is sprayed into a spray tower. The spray tower may, for example, additionally be cooled. In spray towers, cooling rates in the range from $10^3$ to $10^5$ K/s, especially about $10^4$ K/s, are frequently achieved.

The sintering and/or heat treatment of the solid is effected in stage c) preferably first at a temperature in the range from 800 to 1400° C. for sintering and then at a temperature in the range from 500 to 750° C. for heat treatment. These values apply especially to shaped bodies, while lower sintering and heat treatment temperatures can be employed for powders. For example, the sintering can then be effected at a temperature in the range from 500 to 800° C. For shaped bodies/solids, the sintering is more preferably effected at a temperature in the range from 1000 to 1300° C., especially from 1100 to 1300° C. The heat treatment can then be effected, for example, at from 600 to 700° C.

The sintering is performed preferably for a period of from 1 to 50 hours, more preferably from 2 to 20 hours, especially from 5 to 15 hours. The heat treatment is performed preferably for a period in the range from 10 to 100 hours, more preferably from 10 to 60 hours, especially from 30 to 50 hours. The exact periods can be adjusted to the practical requirements according to the materials.

In the case of use of the melt-spinning process, the period for sintering or heat treatment can be shortened significantly, for example to periods of from 5 minutes to 5 hours, preferably from 10 minutes to 1 hour. Compared to the otherwise customary values of 10 hours for sintering and 50 hours for heat treatment, this results in a major time advantage.

The sintering/heat treatment results in partial melting of the particle boundaries, such that the material is compacted further.

The melting and rapid cooling in stage b) thus allows the duration of stage c) to be reduced considerably. This also allows continuous production of the thermomagnetic materials.

Particular preference is given in accordance with the invention to the process sequence of
a) solid phase reaction of chemical elements and/or alloys in a stochiometry which corresponds to the thermomagnetic material in a ball mill,
b) melt spinning the material obtained in stage a),
c) heat treating the solid from stage b) at a temperature in the range from 430 to 1200° C, preferably from 800 to 1000° C, for a period of from 10 seconds or 1 minute to 5 hours, preferably from 30 minutes to 2 hours,
d) quenching the heat treated solid from stage c) at a cooling rate of from 200 to 1300 K/s.

Alternatively, stage c) may comprise grinding of the resulting ribbons to a small-particle material, for example powder, and pressing of the material in a shaped body or processing by other shaping methods.

The thermomagnetic material may be present in any suitable form in the thermomagnetic generator. Preference is given to a form which allows simple and rapid heating and cooling. The thermomagnetic material is preferably present in the form of tubes, plates, meshes, grids or rods. Tubes may be arranged, for example, in the form of tube bundles, and plates may be present in a sequence of parallel plates. The same applies to meshes or grids. The thermomagnetic material is preferably arranged such that good heat transfer is possible with a minimum pressure drop. Shaped bodies such as monoliths or honeycombs can be produced, for example, by a hot extrusion process. It is possible, for example, for cell densities of from 400 to 1600 CPI or more to be present. It is also possible in accordance with the invention to use thin sheets obtainable by rolling processes. Nonporous shaped bodies composed of shaped thin material are advantageous. Metal injection molding (MIM) processes can also be performed in accordance with the invention for shaping.

The heat transfer rate limits the cycle speed and thus has a great influence on the power density. High heat transfer coefficients are obtained, for example, for woven wire meshes or screens. The geometry of the thermomagnetic generator can be optimized as described, for example, by L. D. Kirol and J. I. Mills in Proc. Intersociety Energy Conversion Engineering Conference, San Francisco, Calif., USA, 1984, Vol. 3, 1361.

Typically, the thermomagnetic material is contacted with a fluid as a heat transfer medium. This may comprise gases or liquids, especially air or water. The specific design of the three-dimensional structure is known to those skilled in the art.

A coil of an electrically conductive material is arranged around the thermomagnetic material. In this coil, a current is induced through alteration of the magnetic field or of the magnetization, and can be used to perform electrical work.

Preference is given to selecting the coil geometry and the geometry of the thermomagnetic material so as to result in a maximum energy yield with minimum pressure drop. The coil winding density (turns/length), the coil length, the charge resistance and the temperature change of the thermomagnetic material are important influencing parameters for the energy yield. In order to be able to exploit the magnetocaloric effect within a wide temperature range, it is preferred to arrange a series of at least 3, preferably at least 5 and especially at least 10 different metal-based materials in the thermomagnetic generator, the magnetocaloric effects of which occur at different temperatures, such that the conversion of the thermal energy to electrical energy can exploit a widened temperature range. The thermomagnetic materials may be arranged according to their Curie temperature and be mechanically bonded to one another in a row. This makes it possible to cover a wider temperature range since the effect is integrated via the temperature.

The thermomagnetic material is present in an external magnetic field. This magnetic field can be generated by permanent magnets or electromagnets. Electromagnets may be conventional electromagnets or superconductive magnets.

The thermomagnetic generator is preferably designed such that the thermal energy from geothermal sources or from the waste heat of industrial processes or from solar energy or solar collectors can be converted, for example, in photovoltaics. Specifically in regions with geothermal activity, the inventive thermomagnetic generator allows simple power generation exploiting geothermal heat. In industrial processes, process heat or waste heat frequently arises, which is typically discharged to the environment and is not utilized further. Wastewaters frequently also have a higher temperature on exit than on entry. The same applies to cooling water. The thermomagnetic generator thus allows the recovery of electrical energy from waste heat which is otherwise lost. By virtue of the fact that the thermomagnetic generator can be operated in the region of room temperature, it is possible to utilize this waste heat and to convert it to electrical energy. The energy conversion is effected preferably at temperatures in the range from 20 to 150° C., more preferably at temperatures in the range from 40 to 120° C.

In (concentrated) photovoltaic systems, high temperatures are frequently attained, such that it is necessary to cool. This heat to be removed can be converted to power in accordance with the invention.

For power generation, the thermomagnetic material is contacted alternately with a warm reservoir and a cool reservoir and hence subjected to a warming and cooling cycle. The cycle time is selected according to the particular technical prerequisites. The examples which follow describe the production of thermomagnetic materials suitable for the inventive application.

EXAMPLES

Example 1

Evacuated quartz ampoules which comprised pressed samples of MnFePGe were kept at 1100° C. for 10 hours in order to sinter the powder. This sintering was followed by heat treatment at 650° C. for 60 hours in order to bring about homogenization. Instead of slow cooling in the oven to room temperature, the samples were, however, immediately quenched in water at room temperature. The quenching in water caused a certain degree of oxidation at the sample surfaces. The outer oxidized shell was removed by etching with dilute acid. The XRD patterns showed that all samples crystallized in a structure of the $Fe_2P$ type.

The following compositions were obtained: $Mn_{1.1}Fe_{0.9}P_{0.81}Ge_{0.19}$, $Mn_{1.1}Fe_{0.9}P_{0.78}Ge_{0.22}$, $Mn_{1.1}Fe_{0.9}P_{0.75}Ge_{0.25}$ and $Mn_{1.2}Fe_{0.8}P_{0.81}Ge_{0.19}$. The values observed for the thermal hysteresis are 7 K, 5 K, 2 K and 3 K for these samples in the given sequence. Compared to a slowly cooled sample, which has a thermal hysteresis of more than 10 K, the thermal hysteresis has been greatly reduced.

The thermal hysteresis was determined in a magnetic field of 0.5 tesla.

The Curie temperature can be adjusted by varying the Mn/Fe ratio and the Ge concentration, as can the value of the thermal hysteresis.

The change in the magnetic entropy, calculated from the direct current magnetization using the Maxwell relationship, for a maximum field change of from 0 to 2 tesla, is 14 J/kgK, 20 J/kgK and 12.7 J/kgK respectively for the first three samples.

The Curie temperature and the thermal hysteresis decrease with increasing Mn/Fe ratio. As a result, the MnFePGe compounds exhibit relatively large MCE values in a low field. The thermal hysteresis of these materials is very low.

Example 2

Melt-Spinning of MnFeP(GeSb)

The polycrystalline MnFeP(Ge,Sb) alloys were first produced in a ball mill with high energy input and by solid phase reaction methods, as described in WO 2004/068512 and J. Appl. Phys. 99, 08 Q107 (2006). The material pieces were then introduced into a quartz tube with a nozzle. The chamber was evacuated to a vacuum of $10^{-2}$ mbar and then filled with high-purity argon gas. The samples were melted by means of a high frequency and sprayed through the nozzle owing to a pressure difference to a chamber containing a rotating copper drum. The surface speed of the copper wheel was adjustable, and cooling rates of about $10^5$ K/s were achieved. Subsequently, the spun ribbons were heat treated at 900° C. for one hour.

X-ray diffractometry reveals that all samples crystallize in the hexagonal $Fe_2P$ structure pattern. In contrast to samples not produced by the melt-spinning method, no smaller contaminant phase of MnO was observed.

The resulting values for the Curie temperature, the hysteresis and the entropy were determined for different peripheral speeds in the melt-spinning. The results are listed in Tables 1 and 2 which follow. In each case, low hysteresis temperatures were determined.

TABLE 1

| | V (m/s) | $T_C$ (K) | $\Delta T_{hys}$ (K) | $-\Delta S$(J/kgK) |
|---|---|---|---|---|
| Ribbons | | | | |
| $Mn_{1.2}Fe_{0.8}P_{0.73}Ge_{0.25}Sb_{0.02}$ | 30 | 269 | 4 | 12.1 |
| $Mn_{1.2}Fe_{0.8}P_{0.70}Ge_{0.20}Sb_{0.10}$ | 30 | 304 | 4.5 | 19.0 |
| | 45 | 314 | 3 | 11.0 |
| $MnFeP_{0.70}Ge_{0.20}Sb_{0.10}$ | 20 | 306 | 8 | 17.2 |
| | 30 | 340 | 3 | 9.5 |
| $MnFeP_{0.75}Ge_{0.25}$ | 20 | 316 | 9 | 13.5 |
| | 40 | 302 | 8 | — |
| $Mn_{1.1}Fe_{0.9}P_{0.78}Ge_{0.22}$ | 20 | 302 | 5 | — |
| | 40 | 299 | 7 | — |
| $Mn_{1.1}Fe_{0.9}P_{0.75}Ge_{0.25}$ | 30 | 283 | 9 | 11.2 |
| $Mn_{1.2}Fe_{0.8}P_{0.75}Ge_{0.25}$ | 30 | 240 | 8 | 14.2 |
| $Mn_{1.1}Fe_{0.9}P_{0.73}Ge_{0.27}$ | 30 | 262 | 5 | 10.1 |

TABLE 1-continued

| | V (m/s) | $T_C$ (K) | $\Delta T_{hys}$ (K) | $-\Delta S$(J/kgK) |
|---|---|---|---|---|
| Bulk | | | | |
| $MnFeP_{0.75}Ge_{0.25}$ | | 327 | 3 | 11.0 |
| $Mn_{1.1}Fe_{0.9}P_{0.81}Ge_{0.19}$ | | 260 | 7 | 14.0 |
| $Mn_{1.1}Fe_{0.9}P_{0.78}Ge_{0.22}$ | | 296 | 5 | 20.0 |
| $Mn_{1.1}Fe_{0.9}P_{0.75}Ge_{0.25}$ | | 330 | 2 | 13.0 |
| $Mn_{1.2}Fe_{0.8}P_{0.81}Ge_{0.19}$ | | 220 | 3 | 7.7 |
| $Mn_{1.2}Fe_{0.8}P_{0.75}Ge_{0.25}$ | | 305 | 3 | — |
| $Mn_{1.2}Fe_{0.8}P_{0.73}Ge_{0.27}$ | | 313 | 5 | — |
| $Mn_{1.3}Fe_{0.7}P_{0.78}Ge_{0.22}$ | | 203 | 3 | 5.1 |
| $Mn_{1.3}Fe_{0.7}P_{0.75}Ge_{0.25}$ | | 264 | 1 | — |

TABLE 2

| | $T_C$ (K) | $\Delta T_{hys}$ (K) | $-\Delta S$(J/kgK) |
|---|---|---|---|
| Bulk | | | |
| $MnFeP_{0.75}Ge_{0.25}$ | 327 | 3 | 11.0 |
| $Mn_{1.16}Fe_{0.84}P_{0.75}Ge_{0.25}$ | 330 | 5 | 22.5 |
| $Mn_{1.18}Fe_{0.82}P_{0.75}Ge_{0.25}$ | 310 | 3 | 16.1 |
| $Mn_{1.20}Fe_{0.80}P_{0.75}Ge_{0.25}$ | 302 | 1 | 12.0 |
| $Mn_{1.22}Fe_{0.78}P_{0.75}Ge_{0.25}$ | 276 | 4 | 11.7 |
| $Mn_{1.26}Fe_{0.74}P_{0.75}Ge_{0.25}$ | 270 | 1 | 8.5 |
| $Mn_{1.1}Fe_{0.9}P_{0.81}Ge_{0.19}$ | 260 | 6 | 13.8 |
| $Mn_{1.1}Fe_{0.9}P_{0.78}Ge_{0.22}$ | 296 | 4 | 20.0 |
| $Mn_{1.1}Fe_{0.9}P_{0.77}Ge_{0.23}$ | 312 | 2 | 14.6 |
| $Mn_{1.1}Fe_{0.9}P_{0.75}Ge_{0.25}$ | 329 | 2 | 13.0 |
| Ribbons | | | |
| $Mn_{1.20}Fe_{0.80}P_{0.75}Ge_{0.25}$ | 288 | 1 | 20.3 |
| $Mn_{1.22}Fe_{0.78}P_{0.75}Ge_{0.25}$ | 274 | 2 | 15.3 |
| $Mn_{1.24}Fe_{0.76}P_{0.75}Ge_{0.25}$ | 254 | 2 | 16.4 |
| $Mn_{1.26}Fe_{0.74}P_{0.75}Ge_{0.25}$ | 250 | 4 | 14.4 |
| $Mn_{1.30}Fe_{0.70}P_{0.75}Ge_{0.25}$ | 230 | 0 | 9.8 |

The invention claimed is:

1. A thermomagnetic generator, which comprises a series of at least three different metal-comprising thermomagnetic materials whose magnetocaloric effect occurs at different temperatures, such that conversion of thermal energy to electrical energy can exploit an enlarged temperature range, wherein the at least three materials are selected from the group consisting of (1) a compound of formula (I)

$$(A_yB_{1-y})_{2+\delta}C_wD_xE_z \qquad (I),$$

wherein
A is Mn or Co,
B is Fe, Cr or Ni,
C, D, and E have a non-vanishing concentration and are selected from the group consisting of P, B, Se, Ge, Ga, Si, Sn, N, As, and Sb, whereby at least two of C, D, and E are different, and at least one of C, D, and E is Ge or Si,
δ is a number in a range from −0.1 to 0.1, and
w, x, y, z are numbers in a range from 0 to 1, where w+x+z=1;

(2a) an La- and Fe-comprising compound of formula (II)

$$La(Fe_xAl_{1-x})_{13}H_y \text{ or } La(Fe_xSi_{1-x})_{13}H_y \qquad (II),$$

wherein
x is a number from 0.7 to 0.95, and
y is a number from 0 to 3;

(2b) an La- and Fe-comprising compound of formula (III)

$$La(Fe_xAl_yCo_z)_{13} \text{ or } La(Fe_xSi_yCo_z)_{13} \qquad (III),$$

wherein
x is a number from 0.7 to 0.95,
Y is a number from 0.05 to 1−x, and
z is a number from 0.005 to 0.5;
(2c) an La- and Fe-comprising compound of formula (IV)

$$LaMn_xFe_{2-x}Ge \quad (IV),$$

wherein
x is a number from 1.7 to 1.95;
(3) a Heusler alloy of MnTP composition where T is a transition metal and P is a p-doping metal having an electron count per atom e/a in a range from 7 to 8.5;
(4) a Gd- and Si-comprising compound of formula (V)

$$Gd_5(Si_xGe_{1-x})_4 \quad (V),$$

wherein x is a number from 0.2 to 1;
(5) an Fe$_2$P-comprising compound;
(6) a perovskite manganite;
(7a) a compound comprising at least one rare earth element and having formula (VI)

$$Tb_5(Si_{4-x}Ge_x) \quad (VI),$$

wherein x=0, 1, 2, 3, or 4,
(7b) a compound comprising at least one rare earth element and having formula (VII)

$$XTiGe \quad (VII),$$

wherein X=Dy, Ho, and/or Tm;
(8a) an Mn- and Sb- or As-comprising compound of formula (VIII)

$$Mn_{2-x}Z_xSb \quad (VIII),$$

wherein
Z is Cr, Cu, Zn, Co, V, As, or Ge,
x is from 0.01 to 0.5, and
wherein Sb may be replaced by As when Z is not As; and
(8b) an Ma- and Sb- or As-comprising compound of formula (IX)

$$Mn_2Z_xSb_{1-x} \quad (IX),$$

wherein
Z is Cr, Cu, Zn, Co, V, As, or Ge,
x is from 0.01 to 0.5, and
wherein Sb may be replaced by As when Z is not As.

2. The thermomagnetic generator according to claim 1, wherein the at least three thermomagnetic materials are at least quaternary compounds of general formula (I) which, as well as Mn, Fe, P, and optionally Sb, additionally comprise
Ge or Si or As or Fe and Si, or
Ge and As, or
Si and As, or
Ge, Si and As.

3. The thermomagnetic generator according to claim 1, which is designed such that thermal energy from a geothermal source or from waste heat of an industrial process or from solar energy or a solar collector can be converted.

4. The thermomagnetic generator according to claim 1, wherein the conversion of thermal energy is effected at a temperature in a range from 20 to 150° C.

5. The thermomagnetic generator according to claim 1, wherein the thermomagnetic materials are present in the form of a tube, a plate, a mesh, a grid, a ribbon, a wire, or a rod.

6. The thermomagnetic generator according to claim 1, wherein the metal-comprising materials are obtained by
a) reacting chemical elements and/or alloys in a stoichiometry which corresponds to at least one of the thermomagnetic materials in solid and/or liquid phase, to give a first reaction product;
b) optionally, converting the first reaction product from a), to give a second solid;
c) sintering and/or heat treating the first reaction product from a) or the second solid from stage b), to give a second reaction product; and
d) quenching the second reaction product from stage c) at a cooling rate of at least 100 K/s.

7. The thermomagnetic generator according to claim 1, which converts thermal energy to electrical energy without intermediate conversion to mechanical work.

8. The thermomagnetic generator according to claim 1, which works at a temperature in a range from −20° C. to 200° C.

9. The thermomagnetic generator according to claim 1,
which converts thermal energy to electrical energy without intermediate conversion to mechanical work, and
which works at a temperature in a range from −20° C. to 200° C.

* * * * *

UNITED STATES PATENT AND TRADEMARK OFFICE
CERTIFICATE OF CORRECTION

PATENT NO. : 8,427,030 B2  
APPLICATION NO. : 12/990094  
DATED : April 23, 2013  
INVENTOR(S) : Georg Degen et al.

Page 1 of 1

It is certified that error appears in the above-identified patent and that said Letters Patent is hereby corrected as shown below:

In the Claims:

Column 10, line 47, " $(A\gamma B1_{1-\gamma})_{2+\delta}C_w D_x E_z$ " should read -- $(A\gamma B_{1-\gamma})_{2+\delta}C_w D_x E_z$ --.

Signed and Sealed this  
Twenty-fifth Day of June, 2013

Teresa Stanek Rea  
*Acting Director of the United States Patent and Trademark Office*